United States Patent [19]

Kataoka

[11] Patent Number: 5,166,777
[45] Date of Patent: Nov. 24, 1992

[54] COOLING APPARATUS FOR SUPERCONDUCTING DEVICES USING PELTIER EFFECT COOLING ELEMENT

[75] Inventor: Shoei Kataoka, Tanashi, Japan

[73] Assignee: Sharp Kabishiki Kaisha, Osaka, Japan

[21] Appl. No.: 660,238

[22] Filed: Feb. 25, 1991

Related U.S. Application Data

[63] Continuation of Ser. No. 184,807, Apr. 22, 1988, abandoned.

[30] Foreign Application Priority Data

Apr. 22, 1987 [JP] Japan ................... 62-99325
Jun. 19, 1987 [JP] Japan ................... 62-153841
Jul. 13, 1987 [JP] Japan ................... 62-174443

[51] Int. Cl.$^5$ ............... H01L 25/04; H01L 23/02; H04B 3/28; F25B 21/00
[52] U.S. Cl. ............... 257/716; 505/1; 505/872; 505/889; 505/891; 505/888; 257/661; 257/930
[58] Field of Search ........... 357/83, 84, 87; 136/203, 204; 505/725, 872, 875, 888, 889, 891; 62/3.2

[56] References Cited

U.S. PATENT DOCUMENTS

| | | |
|---|---|---|
| 2,930,904 | 3/1960 | Fritts .................. 357/87 |
| 2,938,357 | 5/1960 | Sheckler ................ 62/3.2 |
| 2,994,203 | 8/1961 | Lackey et al. . |
| 3,109,290 | 11/1963 | Kolenko ................ 62/3.2 |
| 3,414,405 | 12/1968 | Fisher .................. 357/87 |
| 3,560,351 | 2/1971 | Abbott et al. .......... 357/87 |
| 3,751,709 | 8/1973 | Wilson et al. .......... 62/3.2 |
| 3,814,964 | 6/1974 | Ace . |
| 3,998,592 | 12/1976 | Pyle . |
| 4,081,895 | 4/1978 | Germano et al. ........ 357/87 |
| 4,259,843 | 4/1981 | Kausch . |
| 4,362,023 | 12/1982 | Falco .................. 505/891 |
| 4,375,157 | 4/1967 | Boesen . |
| 4,483,341 | 11/1984 | Witteles ............... 62/3.2 |
| 4,512,758 | 4/1985 | Wedemeyer et al. ..... 62/3.2 |
| 4,833,889 | 5/1989 | Harwell et al. ........ 62/3.2 |
| 4,855,810 | 8/1989 | Gelb et al. ........... 357/87 |
| 4,907,060 | 3/1990 | Nelson et al. ......... 357/87 |

FOREIGN PATENT DOCUMENTS

| | | |
|---|---|---|
| 1191395 | 4/1965 | Fed. Rep. of Germany ........ 62/3.2 |
| 2506093 | 8/1975 | Fed. Rep. of Germany ........ 357/87 |
| 63-263751 | 10/1988 | Japan .................... 357/87 |
| 0118280 | 1/1989 | Japan . |
| 1-295449 | 11/1989 | Japan .................... 357/87 |
| 1015985 | 1/1966 | United Kingdom . |

OTHER PUBLICATIONS

"Principles of Superconductive Devices and Circuits", Duzer et al., 1981, Elsvier Publication, pp. 34–35, 92.

"Upper Critical Fields of High-Tc Superconducting $Y_{2-x}Ba_xCu\ O_{4-y}$", Orlando et al., Physical Review B, May 1, 1987, pp. (35) 7249–7251.

"Thermoelectric Power Generation, Thermoelectric Cooling and Solar Battery", written by Kinichi Uemura et al., published by Nikkan Kogyo Shinbunsha on Jul. 28, 1965 (pp. 72–74).

"Semiconductor Sensing Element", written by Shoei Kataoka, published by Nikkan Kogyo Shinbunsha on Apr. 11, 1972 (pp. 188–190).

Primary Examiner—Rolf Hille
Assistant Examiner—Mahshid Saadat

[57] ABSTRACT

A superconductive apparatus including a superconductive member to be cooled, a cooling element which exhibits Peltier effect upon supply of electric power thereto such that the superconductive member is thermally coupled with a cooling portion of the cooling element and a container for accommodating the superconductive member and the cooling portion.

32 Claims, 4 Drawing Sheets

COOLING APPARATUS FOR SUPERCONDUCTING DEVICES USING PELTIER EFFECT COOLING ELEMENT

This application is a continuation of application Ser. No. 07/184,807, filed on Apr. 22, 1988, now abandoned.

BACKGROUND OF THE INVENTION

The present invention generally relates to superconductivity and more particularly, to a superconductive apparatus in which material or an element exhibiting superconductivity and a cooling element are incorporated.

It is known that when a certain electrically conductive material is cooled to low temperatures, for example, a Pb-Nb alloy is cooled to cryogenic temperatures substantially identical with that of liquid helium, superconductivity appears when electric resistance becomes zero. Therefore, if superconductivity is applied to switching elements or highly sensitive sensors, etc., such a remarkably excellent advantage is gained because these elements can be operated without power dissipation. On the other hand, at this time, since cryogenic cooling is necessary, the elements should be accommodated in a cooling device, i.e. a so-called cryostat employing liquid helium and liquid nitrogen. Since this cooling device is large in size, complicated and expensive, these elements are not being put to practical use and thus, superconductivity is not widely applied to general devices at present.

Recently, materials such as ceramics are found to exhibit superconductivity. It is expected that if these materials are employed, a superconductive apparatus operable at much higher temperatures than that of liquid helium can be obtained. However, even if these materials are used, it is indispensably necessary to provide means for cooling the materials to a considerably low temperature in order to induce superconductivity with high reproducibility such that the superconductive apparatus is made more reliable, thereby making the superconductive apparatus large in size and resulting in high production cost of the superconductive apparatus.

SUMMARY OF THE INVENTION

Accordingly, an essential object of the present invention is to provide a compact and inexpensive superconductive apparatus in which an electronic cooling element acting as a cooling means is provided integrally with superconducting material as a package so as to be electrically connected to an external circuit such that the superconductive apparatus can be used with ease substantially in the same way as that of transistors or electronic tubes.

Another important object of the present invention is to provide a superconductive apparatus in which a Peltier effect element is used for cooling a superconductive element exhibiting superconductivity at a low temperature, for example, at 100 K or more such that a magnetic field produced by electric current flowing through the Peltier effect element does not affect operation of the superconductive element.

In order to accomplish these objects of the present invention, there is provided a superconductive apparatus according to one embodiment of the present invention in which a superconductive member to be cooled is thermally coupled with a cooling portion of a cooling element exhibiting Peltier effect upon supply of electric power to the cooling element such that the superconductive member is cooled by the cooling element to a temperature at which the superconductive member exhibits superconductivity.

Furthermore, in the superconductive apparatus of the present invention, a magnetic field produced by electric current flowing through the cooling element is eliminated or minimized and a magnetic shielding member having a large coefficient of thermal conductivity and high magnetic shielding capability is provided between the superconductive element and the cooling element, whereby the superconductive element is magnetically shielded from the magnetic field.

In the superconductive apparatus of the present invention, in order to enhance magnetic shielding effect of the magnetic shielding member, the magnetic shielding member has an area larger than that of the cooling portion of the cooling element and an end portion of the magnetic shielding member is bent towards the cooling element. In addition, the cooling portion of the cooling element and the superconductive member are accommodated in a container so that the superconductive apparatus can be handled easily. Meanwhile, the container is made of a material having high magnetic shielding capability such that an external magnetic field does not affect operation of the superconductive member.

BRIEF DESCRIPTION OF THE DRAWINGS

These objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
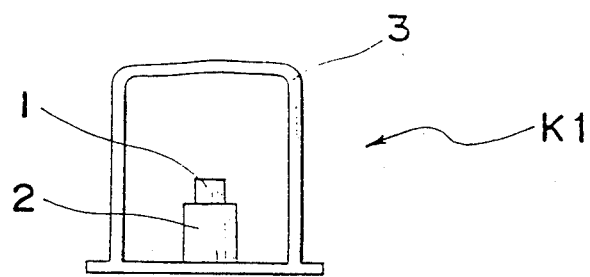
FIG. 1 is a schematic view showing a basic construction of a superconductive apparatus according to a first embodiment of the present invention.

Referring now to the drawings, there is shown in FIG. 1, a superconductive apparatus K1 according to the first embodiment of the present invention. The superconductive apparatus K1 includes a superconductive element 1, a cooler 2 and a container 3 in which the superconductive element 1 and the cooler 2 are accommodated. The superconductive element 1 is obtained with a compound of copper, oxygen, rare earth elements such as lanthanum, barium, yttrium, strontium, bismuth and/or etc. and exhibits superconductivity at a relatively high temperature. The superconductive element 1 is placed on the cooler 2. The cooler 2 incorporates an electronic cooling element having Peltier effect of semiconductor. The superconductive element 1 has superconductive property even at 100 K or more and is used as a Josephson element, a signal amplifying element, a microwave sensor, a magnetic sensor, etc.

Figure 2A:
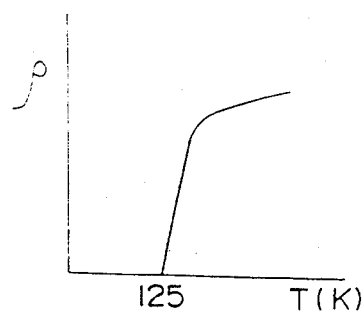
FIGS. 2a and 2b are graphs showing characteristics of a superconductive element employed in the superconductive apparatus of FIG. 1.
Figure 2B:
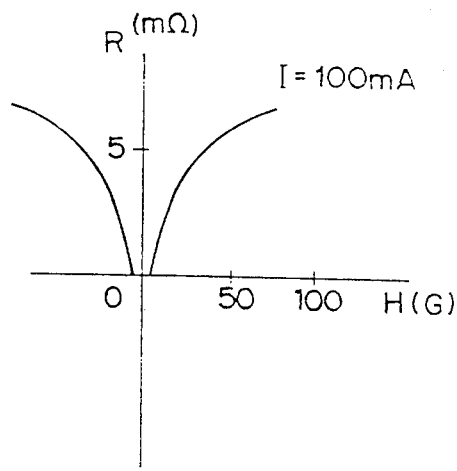

In the superconductive apparatus K1, the superconductive element 1 may be obtained by a rectangular sintered member of thallium, barium, calcium, copper and oxygen, to which electrodes are attached by titanium deposition and silver paste. For example, the rectangular superconductive element 1 has a length of 7 mm, a width of 1 mm and a height of 0.7 mm. In this case, electric resistance of the superconductive element 1 reaches zero at 125 K as shown in FIG. 2a. The superconductive element 1 loses superconductivity upon application of a magnetic field thereto as shown in FIG. 2b, so that the superconductive element 1 has electric resistance and thus, can be used as a sensitive magnetic sensor. In addition to the above described arrangement of the superconductive apparatus K1, the superconductive apparatus K1 can be modified variously, for example into a semiconductor device in which superconducting material is provided, as a connection of a semiconductor circuit, on a cooling plate coupled thermally with an electronic cooling element or an arrangement in which an integrated circuit is placed on the cooling plate.

The superconductive element 1 is bonded, in an excellent state of heat conduction, to the cooler 2 through electrical insulator and is sealed in the container 3 in vacuum or atmosphere of inert gas such as argon, nitrogen, neon, helium, etc. The cooler 2 is secured to an inner face of a bottom wall of the container 3 and is connected to an external circuit through a lead wire. Likewise, lead wires connect the superconductive element 1 and an external circuit so as to form a signal input/output line.

By supplying electric power to the electronic cooling element of the cooler 2, temperature of the cooler 2 drops and thus, the superconductive element 1 coupled thermally with the cooler 2 is cooled to its operating temperature. In the case where an interior of the container 3 is kept under vacuum, condensation does not take place in the container 3 and unnecessary heat conduction or convection does not occur peripherally of the cooler 2, so that the superconductive element 1 is cooled efficiently by the cooler 2.

Figure 3:
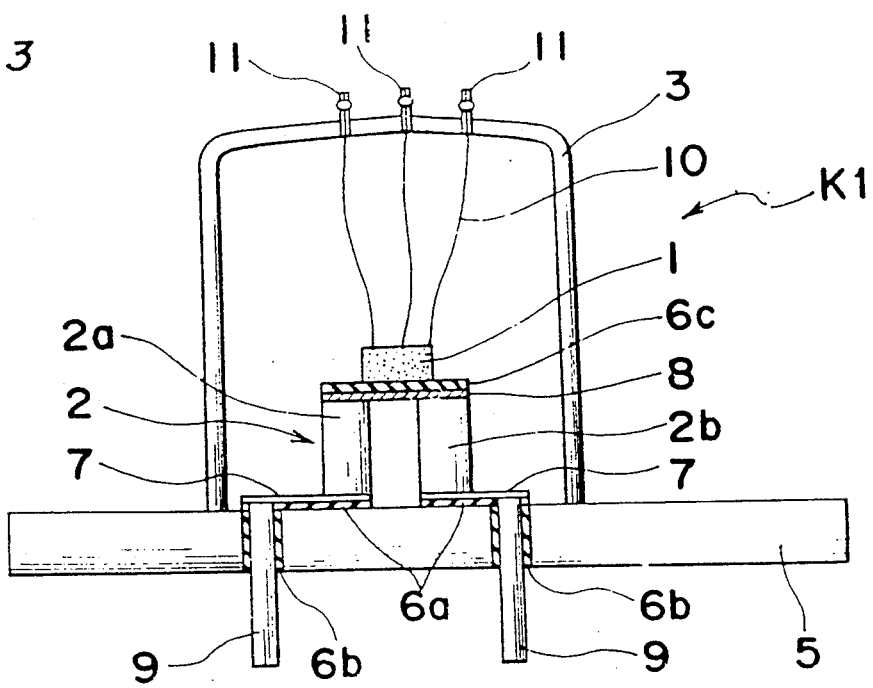
FIG. 3 is a sectional view showing a main portion of a cooling arrangement of the superconductive apparatus of FIG. 1.

FIG. 3 shows a concrete construction of the superconductive element 1 and the cooler 2 of the superconductive apparatus K1. A pair of heat dissipating electrodes 7 of the electronic cooling element are arranged side by side and placed, through a pair of thin electrical insulating layers 6a, on a heat dissipating plate 5 constituting a bottom portion of the container 3, respectively. An end portion of each of P-type and N-type semiconductor pieces 2a and 2b for achieving Peltier effect is coupled with each of the heat dissipating, electrodes 7. A cooling electrode 8 bridges over the other end of the P-type semiconductor piece 2a and the other end of the N-type semiconductor piece 2b. A terminal 9 of a lead wire connected to an external circuit is securely passed, in an electrically insulated state by the use of an electrical insulating layer 6b, through the heat insulating plate 5 and further extends through each of the electrical insulating layers 6a so as to be connected to each of the heat dissipating electrodes 7 such that electric power is supplied to the electronic cooling element. The superconductive element 1 is secured, through an electrical insulating layer 6c, to the cooling electrode 8. It is desirable that the electrical insulating layers 6a, 6b and 6c are made of ceramic material having excellent electrical insulating property and high heat conductivity.

Meanwhile, in the case where the superconductive element 1 is covered by electrical insulator, the electrical insulating layer 6c is not required to be provided. Lead wires 10 are extended from the superconductive element 1 and each of the lead wires 10 is electrically connected to an electrode terminal 11 which fixedly passes through a top wall of the container 3 such that a signal input/output line is formed between the superconductive element 1 and an external circuit by each of the lead wires 10 and the electrode terminal 11. At a joint portion between the heat dissipating plate 5 and a peripheral side wall of the container 3, the container 3 is hermetically sealed.

The peripheral wall of the container 3 is formed by coated glass or glossy metal or is provided with heat insulating material so as to be prevented from absorbing radiant heat from outside. The semiconductor pieces 2a and 2b of the electronic cooling element may be made of an alloy containing bismuth, tellurium, antimony, etc. However, if the semiconductor pieces 2a and 2b are made of oxide semiconductor having an excellent cooling effect at low temperatures or are made of a compound of the oxide semiconductor, a more marked cooling effect can be achieved.

Figure 4A:
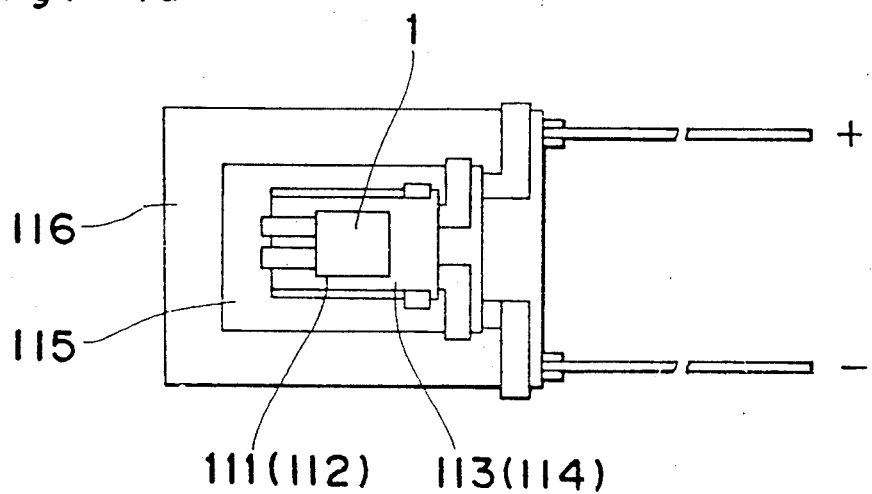
FIGS. 4a and 4b are a top plan view and a side elevational view showing a modification of the cooling arrangement of FIG. 3, respectively.
Figure 4B:
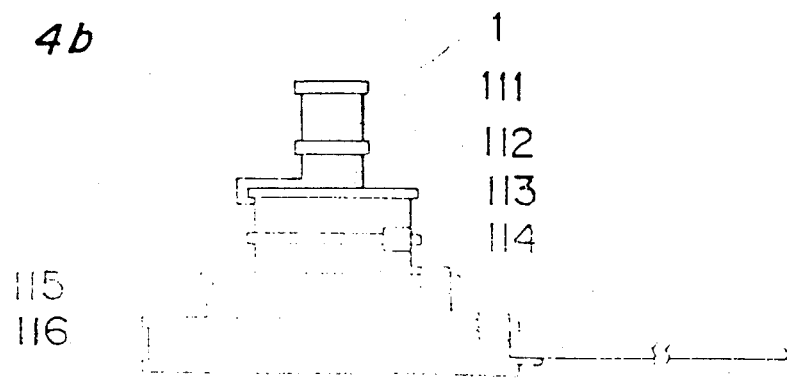

FIGS. 4a and 4b show a cooler 2' which is a modification of the cooler 2 of the superconductive apparatus K1. In the cooler 2', the electronic cooling element is of a six-stage cascade construction and is formed by six crystal semiconductor pieces 111 to 116 piled one on another. Each of the semiconductor pieces 111 to 116 is made of material containing bismuth, tellurium, antimony and selenium. By maintaining a high-temperature portion of the electronic cooling element at 0° C., a low-temperature portion of the electronic cooling element can be cooled to 125 K. Furthermore, when the superconductive element 1 is sealed in a glass container in vacuum, the superconductive element 1 exhibits superconductivity.

In the above described arrangement of the superconductive apparatus K1, by supplying electric power through the terminals 9, the cooling electrode 8 is cooled to low temperatures based on Peltier effect in the container 3 and the low temperatures are transferred to the superconductive element 1. On the other hand, heat produced by the heat dissipating plate 7 is dissipated efficiently outwardly by way of the heat dissipating plate 5.

Figure 5:
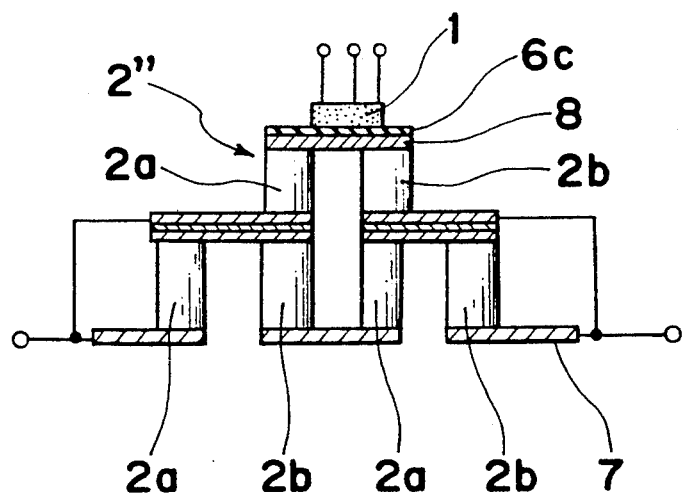
FIG. 5 is a sectional view showing another modification of the cooling arrangement of FIG. 3.

FIG. 5 shows a cooler 2" which is another modification of the cooler 2 of the superconductive apparatus K1. In the cooler 2", the electronic cooling element is of a two-stage cascade construction. By this two-stage cascade construction, the superconductive element 1 placed, through the electrical insulating layer 6c, on the cooling electrode 8 can be cooled to further lower temperatures.

In the electronic cooling element, the P-type semiconductor piece 2a and the N-type semiconductor piece 2b are provided as a pair and cooling of about 50 degrees can be performed easily by a pair of the semiconductor pieces 2a and 2b. In the case where further cooling is necessary, the electronic cooling element is formed in a cascade construction as shown in FIGS. 4 and 5 and cooling capability can be further increased properly by employing the electronic cooling element of a multi-stage cascade construction as necessary. For example, if the electronic cooling element is formed in a three-stage or four-stage cascade construction, cooling of about 150 degrees can be effected easily and thus, the superconductive element 1 can be easily maintained at an absolute temperature of about 125 K. Meanwhile, various elements exhibiting superconductivity at such a low temperature of about 125 K are obtained by a compound of the above described elements, etc.

Figure 6A:
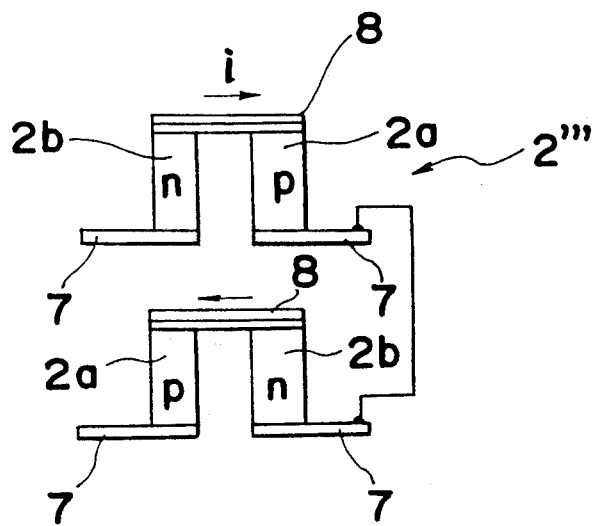
FIGS. 6a and 6b are a schematic view and a perspective view showing still another modification of the cooling arrangement of FIG. 3, respectively.
Figure 6B:
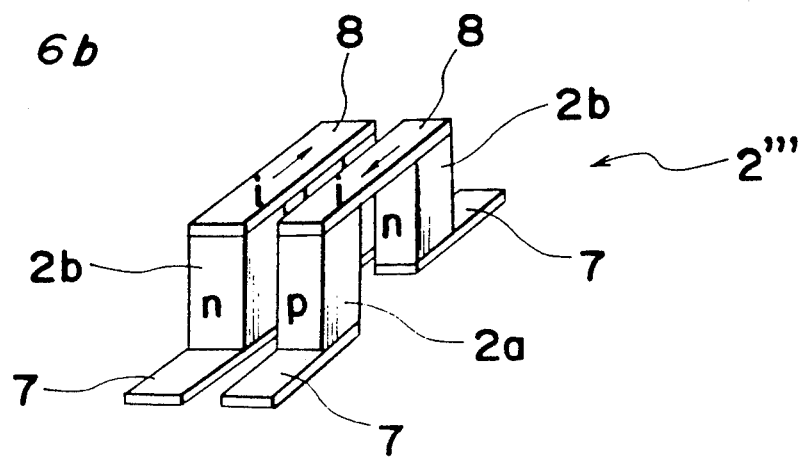

FIGS. 6a and 6b show a cooler 2''' which is still another modification of the cooler 2 of the superconductive apparatus K1. As shown in FIG. 6a, a pair of the electronic cooling elements each including the P-type semiconductor piece 2a and the N-type semiconductor piece 2b are provided and the P-type semiconductor piece 2a of one electronic cooling element and the N-type semiconductor piece 2b of the other electronic cooling element are connected to each other in series. As shown in FIG. 6b, the two electronic cooling elements are juxtaposed such that the semiconductor pieces 2a and 2b of one electronic cooling element confront the semiconductor pieces 2b and 2a of the other electronic cooling element, respectively. By this arrangement of the cooler 2''', a magnetic field formed by the P-type semiconductor piece 2a, the cooling electrode 8 and the N-type semiconductor piece 2b in one electronic cooling element and a magnetic field formed by the P-type semiconductor piece 2a, the cooling element 8 and the N-type semiconductor piece 2b in the other electronic cooling element act so as to eliminate each other, so that ill effect exercised by magnetic field can be counteracted. If three or more electronic cooling elements are sequentially arranged side by side such that electric current flowing through the cooling electrode 8 of one electronic cooling element is oriented in a direction opposite to that of electric current flowing through the cooling electrode 8 of the neighboring electronic cooling element, the cooler having excellent cooling capability can be obtained.

Figure 7:
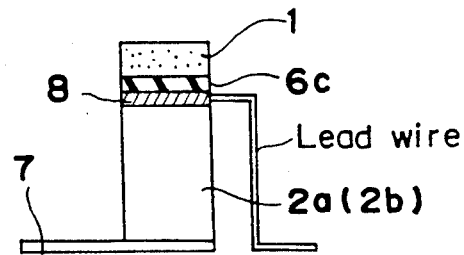
FIG. 7 is a sectional view showing another example of an electronic cooling element employed in the superconductive apparatus of FIG. 1.

Meanwhile, the electronic cooling element is not restricted to a configuration having the P-type and N-type semiconductor pieces 2a and 2b as a pair and may be, needless to say, formed by only one of the P-type and N-type semiconductor pieces 2a and 2b as shown in FIG. 7.

Figure 8:
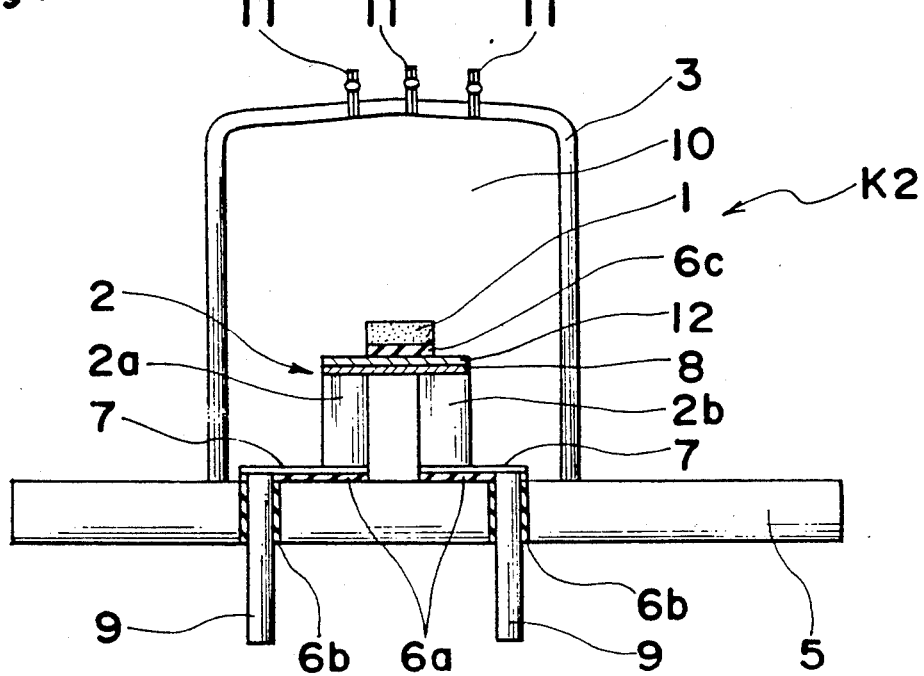
FIG. 8 is a view similar to FIG. 3, particularly showing a second embodiment of the present invention employing a magnetic shielding plate.

FIG. 8 shows a superconductive apparatus K2 according to a second embodiment of the present invention. The superconductive apparatus K2 has such a feature that the superconductive element 1 is secured, through the electrical insulating layer 6c and a magnetic shielding plate 12, to the cooling electrode 8. Since other constructions of the superconductive apparatus K2 are similar to those of the superconductive apparatus K1, description thereof is abbreviated for the sake of brevity. The magnetic shielding plate 12 is made of material having excellent magnetic shielding property and high heat conductivity, for example, one of such ferromagnetic elements as Fe, Co, Ni, Gd, Tb, Dy, Ho, Er, Em, etc., or alloys containing these ferromagnetic elements, or EuO, $CrO_2$, etc. The magnetic shielding plate 12 may be made of superconducting material exhibiting superconductivity at the cooling temperature of the cooler 2. Since superconducting material has a function of completely excluding magnetic field by so-called Meissner effect, superconducting material can be used for magnetically shielding the superconductive element 1. In the superconductive apparatus K1, if the container 3 is made of ferromagnetic material, it is possible to shield the superconductive apparatus K2 from external magnetism.

Figure 9:
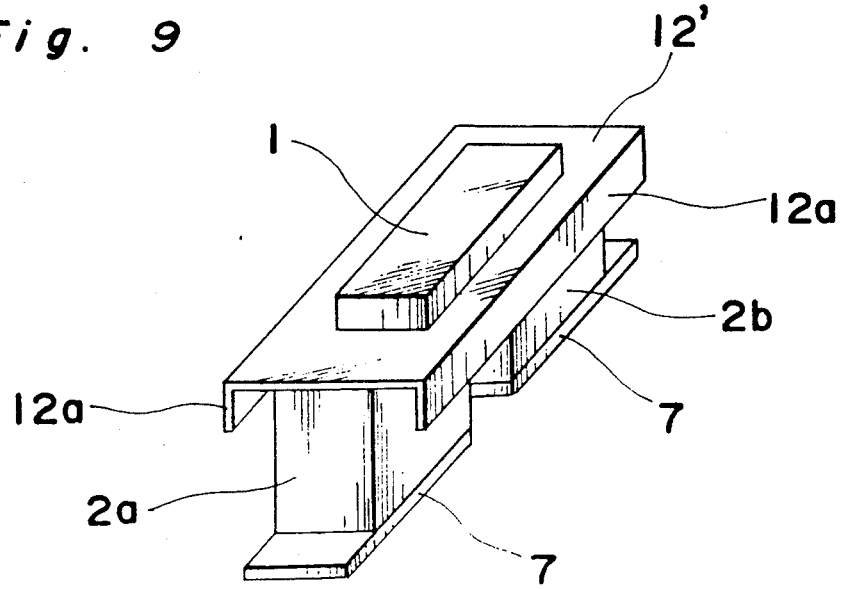
FIG. 9 is a perspective view showing a modification of the magnetic shielding plate of FIG. 8.

FIG. 9 shows a magnetic shielding plate 12' which is a modification of the magnetic shielding plate 12 of the superconductive apparatus K2. The magnetic shielding plate 12' has an area larger than that of the cooling electrode 8 of the electronic cooling element so as to be placed on the cooling electrode 8. Opposite side edges of the magnetic shielding plate 12' are bent downwardly at right angles into a pair of bent portions 12a such that the magnetic shielding plate 12' embraces an upper portion of the electronic cooling element. Thus, since leak of magnetism from the electronic cooling element is prevented by the magnetic shielding plate 12', magnetic shielding of the superconductive element 1 is further improved. Therefore, since the superconductive element 1 mounted on the magnetic shielding plate 12' is shielded by the bent portions 12a of the magnetic shielding plate 12' from a magnetic field from the electronic cooling element, malfunctions of the superconductive element 1 due to the magnetic field are completely obviated.

In the superconductive apparatuses K1 and K2, the superconductive element 1 may be used as a switching element composed of Josephson junction, a highly sensitive sensor including a SQUID (superconducting quantum interference device) or a combination of semiconductor and superconducting material, in addition to those referred to earlier. Furthermore, the superconductive element 1 may be used as an integrated circuit employing superconducting material acting as a wire for connecting circuit elements made of Si, GaAs, etc.

As is clear from the foregoing description, in accordance with the present invention, since the superconducting material can be actuated by the remarkably simple arrangement and control means, the superconductive apparatus can be put to practical use.

Furthermore, in accordance with the present invention, since the superconductive apparatus is simple in construction and easy in production, the superconductive apparatus can be produced at low cost and can be made compact in size.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:
1. A superconductive apparatus comprising:
  a superconductive member to be cooled;
  at least one cooling element which exhibits Peltier effect upon supply of electric power thereto for cooling said superconductive member to it superconductive state;

said superconductive member being thermally coupled with a cooling portion of said at least one cooling element; and a container in which said superconductive member and said cooling portion are located, there being a void between the container and said cooling element the void being selected from the group consisting of a vacuum or inert gas.

2. A superconductive apparatus as claimed in claim 1, wherein said at least one cooling element consists essentially of metallic oxide semiconductor or a compound of the metallic oxide semiconductor.

3. A superconductive apparatus as claimed in claim 1, wherein said container is formed by glass to which a coating film for preventing absorption of radiant heat is bonded.

4. A superconductive apparatus as claimed in claim 1, wherein said container is provided with heat insulating material.

5. A superconductive apparatus as claimed in claim 1, wherein said container is formed by glossy metal.

6. A superconductive apparatus as claimed in claim 1, wherein an interior of said container is kept under vacuum.

7. A superconductive apparatus as claimed in claim 1, wherein an interior of said container is occupied by atmosphere of inert gas.

8. A superconductive apparatus comprising:
a superconductive member to be cooled;
at least one cooling element which exhibits a Peltier effect upon supply of electric power thereto for cooling said superconductive member to a superconductive state;
said superconductive member being thermally coupled with a cooling portion of said at least one cooling element; and
a magnetic shielding member having high heat conductivity and excellent magnetic shielding property, said magnetic shielding member being located between said superconductive member and said cooling element.

9. A superconductive apparatus as claimed in claim 8, wherein said magnetic shielding member is formed by a plate having an area larger than that of said cooling portion such that a portion of said magnetic shielding member overhangs said cooling portion,
said portion of said magnetic shielding member being partially bent towards said at least one cooling element so as to form a bent portion.

10. A superconductive apparatus as claimed in claim 8, further comprising:
a container in which said superconductive member and said cooling portion are located.

11. A superconductive apparatus as claimed in claim 10 wherein said container is formed by a plate made of a material having excellent magnetic shielding property.

12. A superconductive apparatus as claimed in claim 1, wherein said cooling element is includes at least one of a P-type semiconductor element and an N-type semiconductor element.

13. A superconductive apparatus as claimed in claim 8, wherein said element includes at least one of a P-type semiconductor element and an N-type semiconductor element.

14. The superconductive apparatus as claimed in claim 1, wherein there is an electrical insulator located between the superconductive member and said at least one cooling element.

15. The superconductive apparatus is claimed in claim 1, wherein the said at least one cooling element is secured to an inner face of a bottom wall of the container.

16. The superconductive apparatus of claim 1, including a plurality of cooling elements spaced from each other.

17. The superconductive apparatus of claim 16 wherein there is a cooling electrode bridging a space between the plurality of cooling elements.

18. The superconductive apparatus of claim 17, wherein there is an electrical insulator located on said cooling electrode and said superconductive member is located on said electrical insulator.

19. The superconductive apparatus of claim 18, wherein said container includes a heat dissipating plate as a bottom wall.

20. The superconductive apparatus of claim 19, wherein there are plural electrical insulators located on said heat dissipating plate.

21. The superconductive apparatus of claim 20, wherein there is a heat dissipating electrode located on each plural electrical insulator located on said heat dissipating plate.

22. The superconductive apparatus of claim 25, wherein each of said plurality of cooling elements is located on each of said plural electrical insulators.

23. The superconductive apparatus of claim 22, wherein each of said heat dissipating electrodes is operatively connected to an electrical terminal that extends through said heat dissipating plate.

24. The superconductive apparatus of claim 8, wherein there are a plurality of spaced cooling elements.

25. The superconductive apparatus of claim 24, wherein a space between said plurality of cooling elements is bridged by a cooling electrode in contact with a top portion said cooling elements.

26. The superconductive apparatus of claim 25 wherein, there is a magnetic shield in contact with said cooling electrode.

27. The superconductive apparatus of claim 26 wherein, there is an electrical insulator located between said superconductive member and said magnetic shield.

28. The superconductive apparatus of claim 27 wherein, a bottom portion of each of said cooling elements is in contact with a heat dissipating plate.

29. The superconductive apparatus of claim 28 further including a container with a bottom portion, said heating dissipating plate being separated from said bottom portion by an insulator.

30. The superconductive apparatus of claim 29, further including a electrical terminal operatively connected to each of said cooling elements, said terminals extending through said bottom portion.

31. The superconducting apparatus of claim 17, wherein the container is a ferro magnetic material so that the superconductive member will be protected from external magnetics.

32. A superconductive apparatus as claimed in claim 7, wherein the inert gas is selected from the group consisting of argon, nitrogen, neon, or helium.

* * * * *